United States Patent

Roethlingshoefer et al.

[11] Patent Number: 5,990,028
[45] Date of Patent: Nov. 23, 1999

[54] DIELECTRIC PASTE

[75] Inventors: Walter Roethlingshoefer, Reutlingen; Annette Seibold, Rutesheim, both of Germany; Susumu Nishigaki, Nagoya, Japan

[73] Assignee: Robert Bosch GmbH, Stuttgart, Germany

[21] Appl. No.: 08/934,489

[22] Filed: Sep. 19, 1997

[30] Foreign Application Priority Data

Sep. 19, 1996 [DE] Germany ............... 19638195

[51] Int. Cl.$^6$ .................. C04B 35/468
[52] U.S. Cl. ............ 501/137; 252/572; 501/138; 501/139
[58] Field of Search .................. 501/134, 135, 501/136, 137, 138, 139; 252/572

[56] References Cited

U.S. PATENT DOCUMENTS 4,220,547  9/1980  Abe et al. .................. 501/137

OTHER PUBLICATIONS

WPIDS Abstract No. 93–072019, abstract of Japanese Patent Specification No. 05–020924, Jan. 1993.

Primary Examiner—Anthony Green
Attorney, Agent, or Firm—Kenyon & Kenyon

[57] ABSTRACT

A high-dielectric lead-free paste serves for the manufacture of at least one area having a high dielectric constant in a ceramic multilayer circuit. The lead-free dielectric paste is basically made of barium titanate nano powder of a suitable particle size and sinters at temperatures below 1000° C., preferably in a range of 800° C. to 1000° C.

2 Claims, 2 Drawing Sheets

DIELECTRIC PASTE

BACKGROUND INFORMATION

Dielectric pastes sintering at temperatures below 1000° C. are known, which however contain lead as an essential component. In the article "New Capacitor Dielectrics Covering K=2,000–12,000 for Printing and Firing Applications below 1000° C." of the Proceedings of the International Symposium on Microelectronics of 1992, p. 445, a high-dielectric paste sintering below 1000° C., based on lead perowskites, is presented.

SUMMARY OF THE INVENTION

The dielectric paste and process according to the present invention have the advantage over the background art of providing a lead-free dielectric paste with a high dielectric constant and sintering at low temperatures, which therefore can also be used in LTCC multilayer circuits (LTCC=Low-Temperature Cofiring Ceramics). These lead-free dielectric pastes have a dielectric constant greater than 200 and a loss factor of less than 5%, together with a heat expansion coefficient matching that of the LTCC materials, and which sinter at low temperatures (800–1000° C.) and therefore can be used in such low-temperature sintering ceramic multilayer circuits. Lead is a toxic element and therefore is to be avoided for ecological reasons. Lead-free materials also result in technological advantages for the circuits. The high dielectric constant paste according to the present invention is compatible with AG, AgPd, AgPt, AgPdPt, and AgAu pastes, which are sintered in ceramic multilayer circuits together with the other LTCC materials. The shrinkage characteristics of the lead-free paste also matches those of the LTCC materials that are sintered together with such a high dielectric constant paste during the manufacture of ceramic multilayer circuits.

The use of barium titanate in the manufacture of high dielectric constant, lead-free paste represents the use of an easily accessible material.

Additional lead-free additives increase the sinterability of the material at relatively low temperatures and improve the shrinkage characteristics of the material when used in LTCC circuits.

The lead-free dielectric paste can be advantageously used for the manufacture of an LTCC multilayer circuit with at least one high dielectric constant area. Simple embodiments are the filling of holes in a layer of the ceramic multilayer circuit with this lead-free paste or the manufacturing of a layer of the ceramic multilayer circuit made of the lead-free dielectric paste, or a local application of the paste on one of the layers of the ceramic multilayer circuit using a printing process.

The lead-free dielectric paste is based on a simple manufacturing process using, for example, the easily accessible barium titanate.

By using the lead-free dielectric paste, capacitors, for example, can also be easily integrated from the point of view of electromagnetic compatibility, for example, without using lead-containing materials. The use of the paste with a high dielectric constant results in economical use of space and surface-mounted capacitive components in ceramic multilayer circuits. A three-dimensional arrangement of active components, for example, high-performance filter components required for electromagnetic compatibility, becomes possible.

DETAILED DESCRIPTION

The paste according to the present invention is described through its manufacturing process, since this is how the reasons for the advantages of the paste can be presented best.

Barium titanate nano powder is used, for example, for the manufacture of the high-dielectric lead-free paste. It is essential that the material be lead-free and have a $D_{50}$ particle size of between 0.05 and 0.5 μm. $D_{50}$ means that 50% of the particles of the nano powder have a smaller diameter than the given numerical value. $Cu_2O$, $CuO$, $Fe_2O_3$, $Bi_2O_3$, $CoO$, $Sb_2O_3$, $Ta_2O_3$, $Mn_2O_3$, $TiO_2$, for example, are used as additives. The additives are used in a proportion of 1 to 15 weight percentages. Sinterability of barium titanate at temperatures below 1000° C. has been previously achieved by adding lead-containing glasses. By using the fine-grain material with the above-mentioned $D_{50}$ particle size, sinterability at approximately 900° C. can be achieved without lead additives. Sinterability and-shrinkage characteristics of the material are adjusted through additives. The material characteristics are optimized by suitable grinding, suitable heat treatment (calcining) after the preparation of the mixture from the nano powder, and additives; finally a paste is obtained by adding organic substances (e.g., acrylic resins, ethyl cellulose, terpineols). Optimizing here means that the sintering temperature required in ceramic multilayer circuit applications is kept as low as possible.

Such a lead-free dielectric paste can be used together with LTCC materials (low-temperature cofiring ceramics). LTCC materials consist, for example, of aluminum oxides and $CaO-Al_2O_3-B_2O_3-SiO_2$ glass or $SiO_2-Al_2O_3-CaO$ class composites. Such LTCC materials are then sintered in a temperature range between 800° and 1000° C. Compared to lead-containing materials, the lead-free dielectric paste is more viscous during sintering. In the presence of silver in a ceramic multilayer circuit, this results in reduced silver diffusion, which explains the good compatibility with silver. Since the raw material for the manufacture of the dielectric paste has a very fine particle size, high tear strength is obtained after sintering, and the material shrinks more evenly when cooled after sintering. Also, fewer pores are formed.

Figure 1:
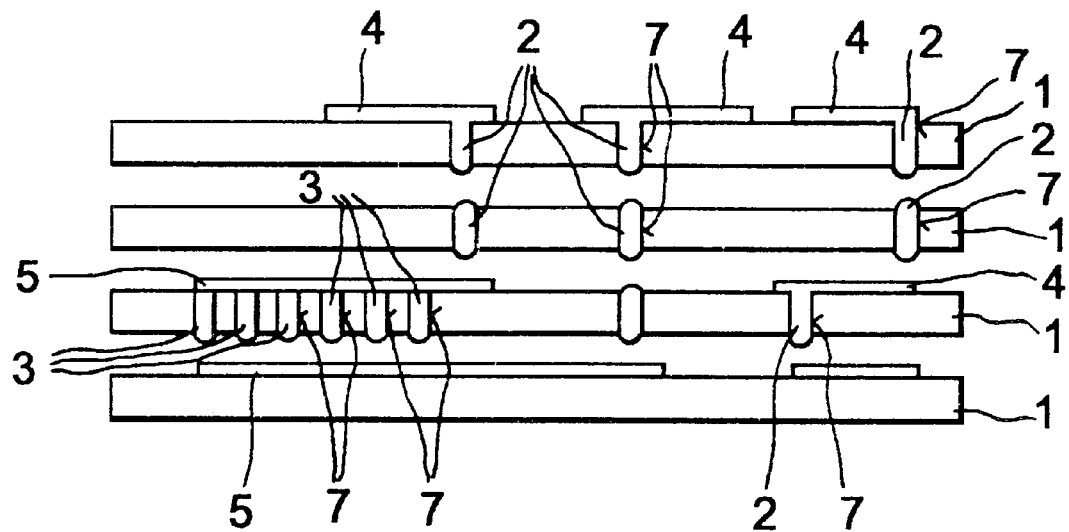
FIG. 1 shows an embodiment of the use of the lead-free dielectric paste in a ceramic multilayer circuit according to the present invention.

FIG. 1 shows one embodiment of the application of the lead-free dielectric paste for obtaining at least one high dielectric constant area. A ceramic LTCC multilayer circuit is made of green ceramic sheets 1, provided with holes 7 at certain predefined points. Circuit paths 4 and capacitor electrodes 5 are applied to the ceramic sheets. The holes are filled with a metal paste 2, in which case they serve as electric feed-throughs through a ceramic layer. Alternatively, these holes 7 can be filled with a dielectric paste, in particular with the lead-free high dielectric constant paste 3 according to the present invention. An area with a high dielectric constant can be made in this simple manner between capacitor electrodes 5 by filling holes 7 with the high-dielectric paste 3.

Figure 2:
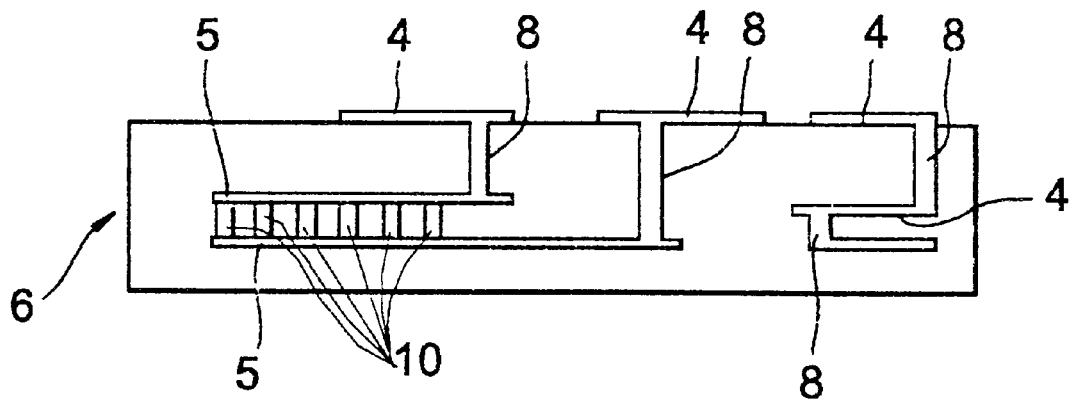
FIG. 2 shows the ceramic multilayer circuit of FIG. 1 after sintering.

FIG. 2 shows the ceramic multilayer circuit after sintering. Ceramic sheets 1 have "fused" into ceramic multilayer circuit 6. Circuit paths 4 are electrically connected to other circuit paths via feed-throughs 8 through one or more ceramic layers or in a capacitive contact with another circuit path arranged above or below them via areas 10 having a high dielectric constant. Alternatively, area 10, having a high dielectric constant, can also be formed as an entire layer of the ceramic multilayer circuit made of the lead-free dielectric paste.

Figure 3:
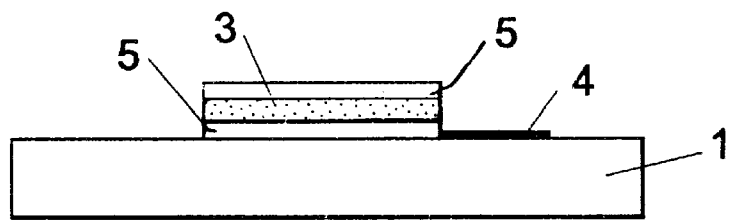
FIG. 3 shows a first part of an example of application of the lead-free dielectric paste according to the present invention.
Figure 4:
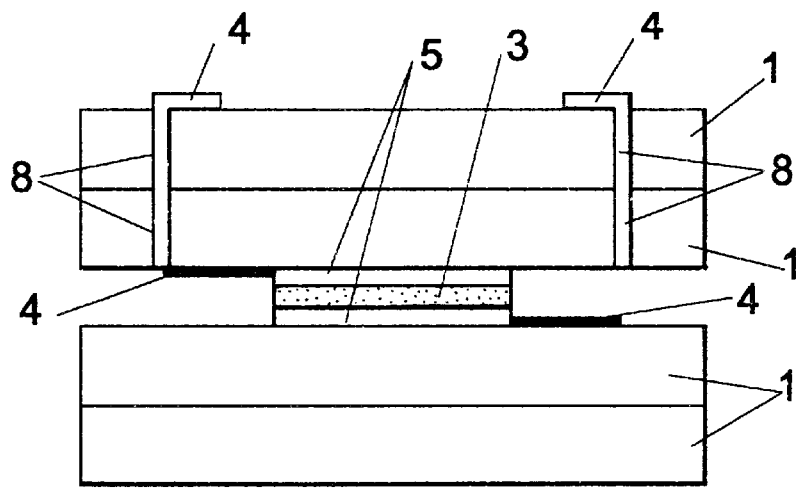
FIG. 4 shows a second part of an example of application of the lead-free dielectric paste according to the present invention.
Figure 5:
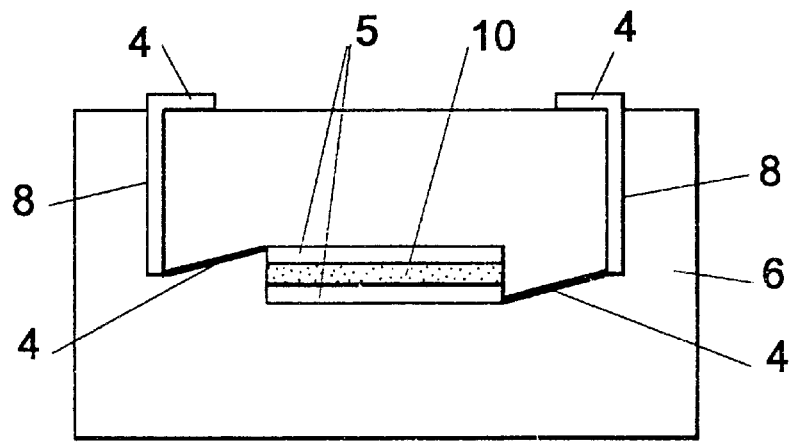
FIG. 5 shows a third part of an example of application of the lead-free dielectric paste according to the present invention.

According to FIG. 3, the lead-free dielectric paste 3 can also be applied locally in a printing process. In this case, a circuit path 4 and a capacitor electrode 5 are arranged first on a green ceramic sheet 1, the lead-free dielectric paste 3 is applied locally to capacitor electrode 5, and an additional capacitor electrode is applied. Green ceramic sheets 1, suitably prepared with feed-throughs 8 and circuit paths 4, are applied in an additional step according to FIG. 4 on the arrangement of FIG. 3. After sintering, a ceramic multilayer circuit 6 according to FIG. 5 is obtained with an arbitrarily selected local area 10 having a high dielectric constant.

The application of the lead-free dielectric paste is, of course, not limited to the above-described embodiments, but is always advantageous wherever a high-dielectric material must be provided that sinters at temperatures below 1000° C., has matching shrinking characteristics or a matching expansion coefficient, and contains no lead.

What is claimed is:

1. A lead-free dielectric paste, comprising:
   a barium titanate composition composed of particles which have a particle size $D_{50}$ between 0.05 μm and 0.5 μm; and
   at least one additive selected from $Cu_2O$, $CuO$, $Fe_2O_3$, $Bi_2O_3$, $CoO$, $Sb_2O_3$, $Ta_2O_3$, $Mn_2O_3$, or $TiO_2$ which is added to the barium titanate composition, the at least one additive having a weight percentage between 1% and 15%,
   wherein the lead-free dielectric paste is designed for being utilized in a low-temperature cofiring ceramic ("LTCC") multilayer circuit.

2. The lead-free dielectric paste according to claim 1, wherein the lead-free dielectric paste is designed for being sintered at a temperature which is in a range between 800° C. and 1000° C.

* * * * *